United States Patent [19]

Burnett et al.

[11] Patent Number: 4,841,268

[45] Date of Patent: Jun. 20, 1989

[54] MRI MAGNET SYSTEM WITH PERMANENTLY INSTALLED POWER LEADS

[75] Inventors: Sibley C. Burnett, Cardiff; John R. Purcell, San Diego; Bruce C. Breneman, San Diego; Raymond E. Sarwinski, San Diego, all of Calif.

[73] Assignee: General Atomics, San Diego, Calif.

[21] Appl. No.: 101,517

[22] Filed: Sep. 28, 1987

[51] Int. Cl.$^4$ .............................................. H01F 7/22
[52] U.S. Cl. .................................. 335/216; 174/15.4; 62/51.1
[58] Field of Search .................. 335/216; 174/15 CA, 174/15 S, 15 HP; 62/514 R

[56] References Cited

U.S. PATENT DOCUMENTS

| | | | |
|---|---|---|---|
| 4,544,979 | 10/1985 | Ennis et al. | 335/216 X |
| 4,625,193 | 11/1986 | Purcell | 335/216 |
| 4,635,450 | 1/1987 | Laskaris | 62/514 R |
| 4,655,045 | 4/1987 | Matsumoto et al. | 62/45 |
| 4,689,439 | 8/1987 | Sato | 335/216 |
| 4,689,707 | 8/1987 | Schwall | 335/216 |
| 4,695,675 | 9/1987 | Yamamoto | 335/216 |

Primary Examiner—George Harris
Attorney, Agent, or Firm—Fitch, Even, Tabin & Flannery

[57] ABSTRACT

A magnet system, having permanently installed power leads, for providing a magnetic field. The system includes a vacuum vessel and a cryogenic containment vessel supported within the vacuum vessel. The containment vessel holds a main coil formed of superconductive wire, along with a quantity of liquid helium to maintain the wire below its critical temperature. The power leads, which supply energy to the coil from a power supply outside the vacuum vessel, also take energy from the coil to a load resistor outside the vacuum vessel when the coil is discharged, each include an elongate metallic tube. The magnet system also includes a solenoid controlled valve which is responsive to the passage of electric current through the tubes of the power leads to cause helium gas resulting from the boiling of liquid helium in the containment vessel to be vented to atmosphere through the tube thereby cooling them.

11 Claims, 3 Drawing Sheets

MRI MAGNET SYSTEM WITH PERMANENTLY INSTALLED POWER LEADS

This invention relates to electrical conductors and, more particularly, power leads permanently connected to a coil of superconductive wire in a magnet system.

BACKGROUND OF THE INVENTION

MRI magnet systems typically include a cylindrical vacuum vessel having a bore for receiving the subject of the imaging. A cryostat or cryogenic containment vessel supported inside this vacuum vessel houses the coil of superconductive wire which provides the high strength, substantially homogeneous magnetic field necessary for imaging. The cryostat also contains liquid helium (which has a boiling point of about 4.2° K.) for maintaining the wire below its critical temperature.

Copper power leads, extending from the leads of the coil to outside the vacuum vessel, are commonly used for energizing the coil from an outside power supply and for deenergizing the coil by connecting it to a resistive load outside the vacuum vessel. One of the problems with using permanently installed leads is that they are also excellent thermal conductors and thus transmit excess heat to the containment vessel resulting in increased consumption of expensive liquid helium.

To overcome the problem of continuous thermal conduction, power leads have been proposed which can be removed after energization of the coil. The use of removable leads usually requires the provision of an internal load resistor for protection of the magnet coil. Removal and reinsertion of the removable leads often results in the formation of ice which causes blockages thereby making the leads difficult to reinsert when the magnetic field must be changed or the coil discharged. Thus if the continuous heat leakage of the permanently installed leads were sufficiently low, their use would be preferable because of their greater reliability and greater safety because they can be continuously connected to the outside load resistance after charging of the coil.

For further information on the structure and operation of an MRI magnet system with fixed power leads, reference may be made to U.S. Pat. No. 4,655,045. An example of such a system with retractable leads is shown in U.S. Pat. No. 4,635,450. A lead assembly for a magnet coil which is in a tube which vents helium gas, is shown in commonly-assigned U.S. Pat. No. 4,625,193.

SUMMARY OF THE INVENTION

Among the several aspects and features of the present invention may be noted the provision of improved permanently installed power leads for an MRI magnet system. The power leads have increased resistance to thermal conduction so that the heat introduction through the leads when the magnet coil is in its persistent mode (no current passes through the leads) is greatly minimized. The leads are automatically cooled when they conduct current by the passage of helium gas through them from the cryogenic containment vessel. Thus, although they may have higher electrical resistance than copper leads, the tubular power leads of the present invention are cooled by substantial passage of helium gas only when they conduct current. As the magnet coil is in its persistent mode of operation the great majority of the time so that substantial venting of the helium gas is not required, the net result is significantly reduced consumption of liquid helium. The magnet system incorporating the power leads of the present invention is reliable in use, has long service life and is relatively easy and economical to manufacture. Other aspects and features of the present invention will be, in part, apparent and, in part, pointed out specifically in the following specification and in the accompanying drawings.

Briefly, the magnet system includes a vacuum vessel having a first wall defining a bore for receiving the object of the imaging and a cryogenic containment vessel inside the vacuum vessel. The containment vessel houses the main magnet coil which is formed of superconductive wire for providing the magnetic field, along with a quantity of liquid helium to maintain the wire below its critical temperature. The system also includes a pair of permanently installed power leads for supplying energy to the coil from a power supply outside the vacuum vessel to charge the coil, and for removing energy from the coil to an external load resistor to discharge the coil. Each of these power leads includes an elongate metallic tube. The magnet system also includes a solenoid controlled valve which is responsive to the passage of electrical current through the tubes to cause helium gas resulting from the boiling of liquid helium in the containment vessel to be vented to atmosphere through the tubes to cool them.

BRIEF DESCRIPTION OF THE DRAWINGS

Corresponding reference characters indicate corresponding components throughout the several views of the drawings.

DETAILED DESCRIPTION OF THE PREFERRED EMBODIMENT

Figure 1:
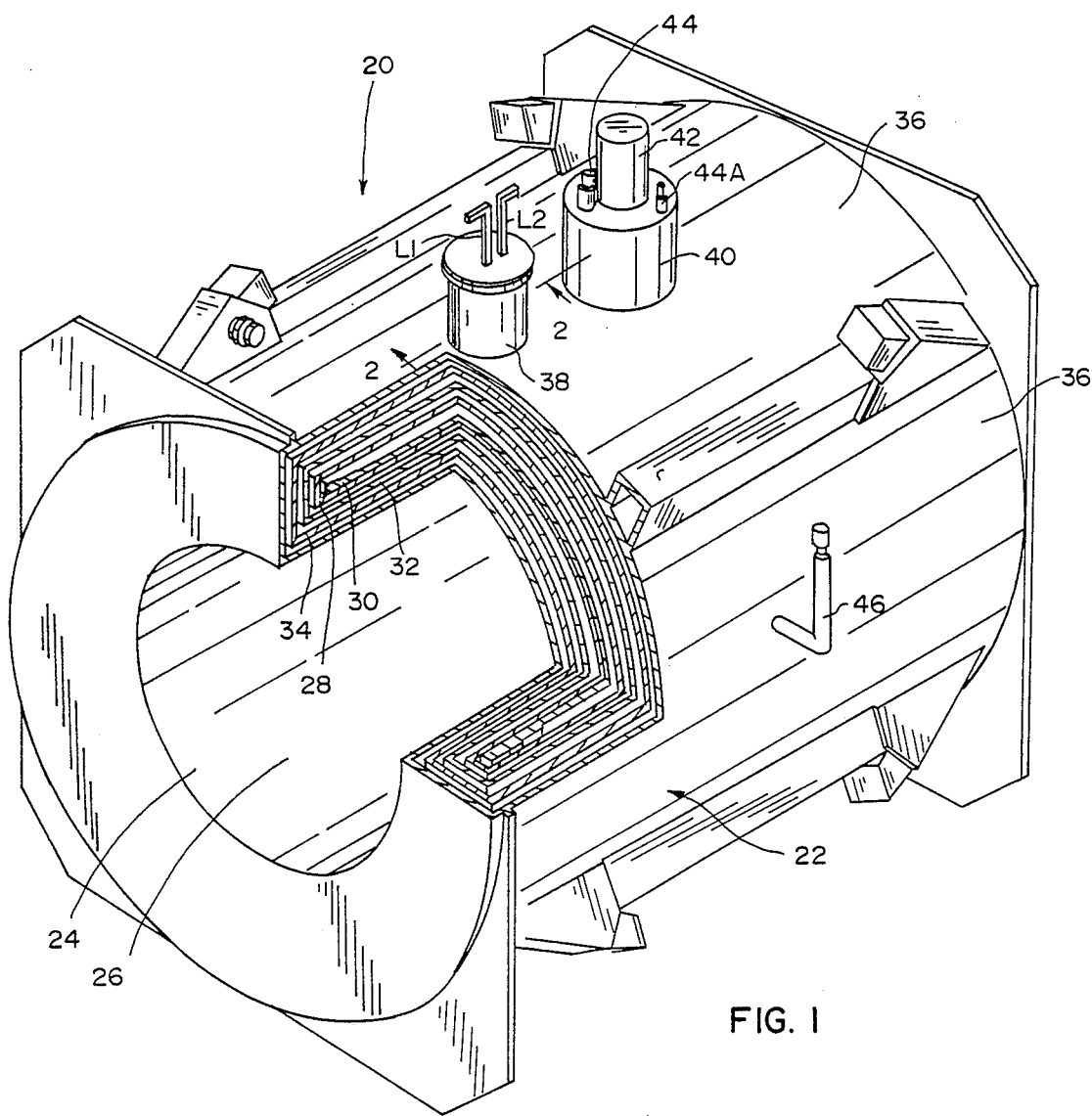
FIG. 1 is an isometric projection of an MRI magnet system including permanently installed power leads embodying various aspects of the present invention, with certain components broken away to expose other components.

Referring to the drawings, a magnet system incorporating power loads embodying various features of the present invention is generally indicated in FIG. 1 by reference numeral 20. The magnet system includes a vacuum vessel 22 including a cylindrical first wall 24 defining a bore 26 for receiving the subject of the imaging. A vacuum (0 psia) is maintained inside the vacuum vessel, the outside of the vessel being at ambient temperature (about 300° K.). Disposed supported within the vessel 22 is a cryostat or cryogenic containment vessel 28 housing the coil 30 of superconductive wire for providing the high strength, substantially homogenous magnetic field in a predetermined location in the bore, along with liquid helium to maintain the wire below its critical temperature to conduct current without resistance.

The magnet system also includes an inner thermal radiation shield 32, also known as a 20° K. shield, disposed between containment vessel 28 and vacuum vessel 22. An outer thermal radiation shield 34, also known as an 80° K. shield, is positioned between the inner shield 32 and the vacuum vessel 22. Each shield is made up of an inner tube, an outer tube and annular end pieces joining the respective tubes. A preferable construction material for the radiation shields is an aluminum alloy which is a good thermal and electrical conductor. Space between the various vessels and shields may contain so-called "superinsulation", not shown, formed of insulating material, such as aluminized Mylar (a registered trademark of DuPont for polyester), which further reduces the transmission of thermal energy to the liquid helium. Extending from the outer wall 36 of the vacuum vessel are a first turret 38 for housing the power leads for the coil 30 and other electrical connections, a second turret 40 supporting a cryogenic refrigerator 42 and liquid nitrogen vent and fill ports 44 and 44A, and a liquid helium vent and fill port 46.

Figure 2:
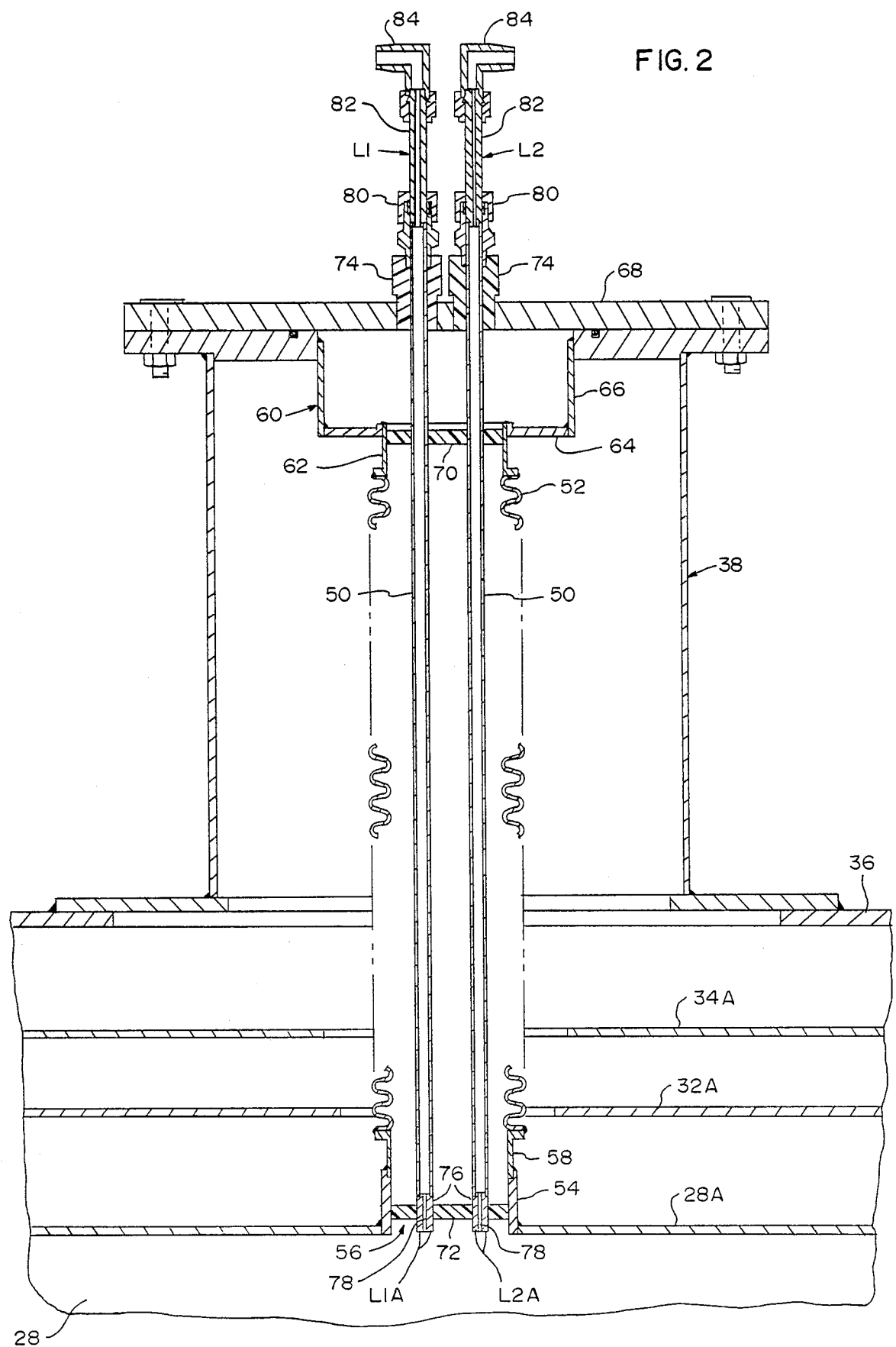
FIG. 2 is a partial cross-sectional view taken generally along line 2—2 in FIG. 1 to show the power leads which extend from the cryostat, through a turret joined to a vacuum vessel, and outside of the turret.

Referring now to FIG. 2, the power leads L1 and L2 each include an elongate thin-wall metallic tube 50, preferably formed of stainless steel. The power leads L1 and L2 are disposed inside of a generally cylindrical bellows section 52, the lower end of which is connected to a fitting cylinder 54, welded to the material defining an opening 56 in the outer tube 28A of the cryogenic containment vessel 28, by means of an annular coupling 58. Similarly, the upper end of the bellows section 52 is connected to an upper support assembly 60 by an annular coupling 62. The assembly 60 includes a horizontal plate 64 having an opening receiving the section 52, and a vertically-extending cylindrical portion 66 welded to plate 64 and an upper wall 68 of the turret 38. The bellows section 52 provides a degree of flexibility between containment vessel 28 and vacuum vessel 22, to allow relative deflection between the two due to shocks caused by, for example, movement of the magnet to its site.

The power leads L1, L2, which extend from the containment vessel 28, through the bellows section 52 and out of the turret 38, are held by spaced horizontal insulative supports 70 and 72 with the leads extending through side-by-side insulative bushings 74 held in openings of the turret upper wall 68. More specifically, each power lead, besides including the tube 50, comprises a plug 76 of electrically conductive material and having an elongate aperture 78 extending therethrough for communicating helium gas from the containment vessel 28 to the interior of the tube 50. The lower end of each plug is connected to the corresponding lead L1A or L2A of the superconductive coil 30 by means well known to those of skill in the art. The upper end of the plug, which is of reduced diameter, is received by the lower end of the tube 50. Besides holding the upper ends of the tubes 50, the bushings 74 also seat electrical connectors 80 joining the stainless steel tubes 50 to copper tubes 82 which are interconnected with an external power supply PS1 (shown in FIG. 3) by conventional lead assemblies.

Figure 4:
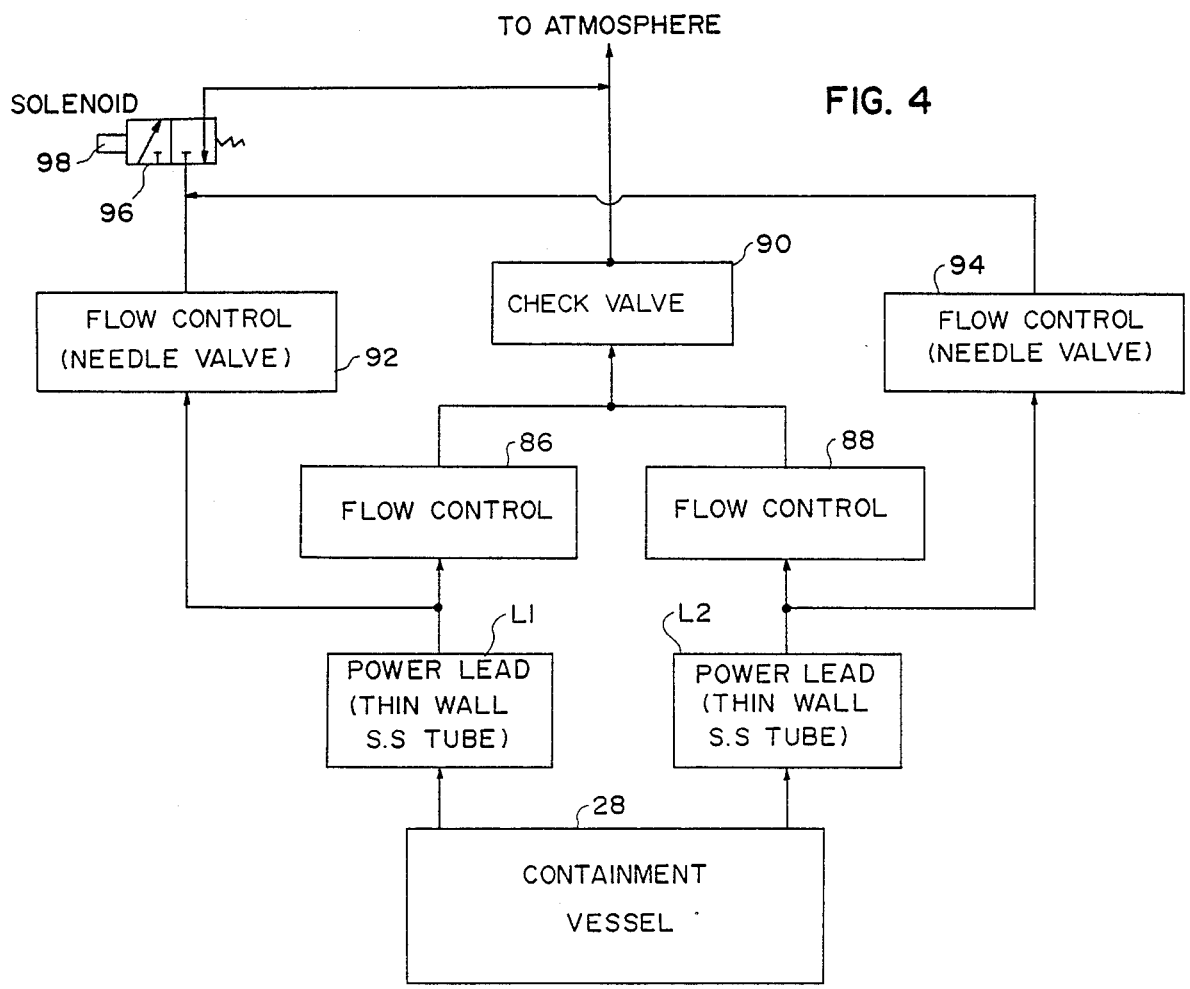
FIG. 4 is a block diagram illustrating how helium vapor resulting from boiling of liquid helium in the cryostat is employed to cool the power leads.

Mounted on each copper tube 82 is an elbow fitting 84 for use in venting the helium gas passing through the power leads L1, L2 to atmosphere through various flow controls as shown by the block diagram of FIG. 4. It will be appreciated that as the liquid helium in the containment vessel 28 boils, a pressure above that of atmosphere is developed. Various regulators, not shown, are preferably employed to maintain this internal pressure constant, for example, 1 psig. One escape route for the very cold helium gas is through the power leads L1, L2, made up of the plugs 76, stainless steel tubes 50, electrical connectors 80 and copper tubes 82. As shown in FIG. 4, there are two parallel paths in this route. The first path, which permits substantially constant leakage of a relatively small amount of helium gas (e.g., 10 cc/hr) is through flow controls 86 and 88 (which may be needle valves) and a check valve 90. The leakage of the cold helium gas through this first path is intended to compensate for heat conduction to the containment vessel through the stainless steel tubes 50, thereby maintaining the coil 30 below its critical temperature with low consumption of expensive liquid helium.

The second path to atmosphere of the helium gas passing through the permanently installed power leads L1, L2 is through flow controls 92 and 94, the outputs of which merge at the input to a solenoid valve 96. Flow controls 92 and 94 may also be needle valves and they are set slightly open (but still much greater than in the first path) to permit passage of the helium gas at an exemplary rate of about 1–10 l/hr. The solenoid valve, shown in block form in FIG. 4, may be of conventional construction including a valve body with a valve movable between a first closed position wherein the valve blocks the escape of the gas and a second open position in which the valve permits limited passage of the helium gas to the outside atmosphere thus carrying away significant thermal energy from the tubes 50. The solenoid valve 96 is biased (for example, by a spring) to its closed first position, and switching to its open second position is controlled by a solenoid coil 98 shown interconnected with the main magnet coil 30 in FIG. 3 so that upon passage of substantial current through the power leads L1, L2 the heat occasioned by the electrical resistance of the tubes is compensated for by the greatly increased flow rate of the very cold helium gas through the tubes 50

Figure 3:
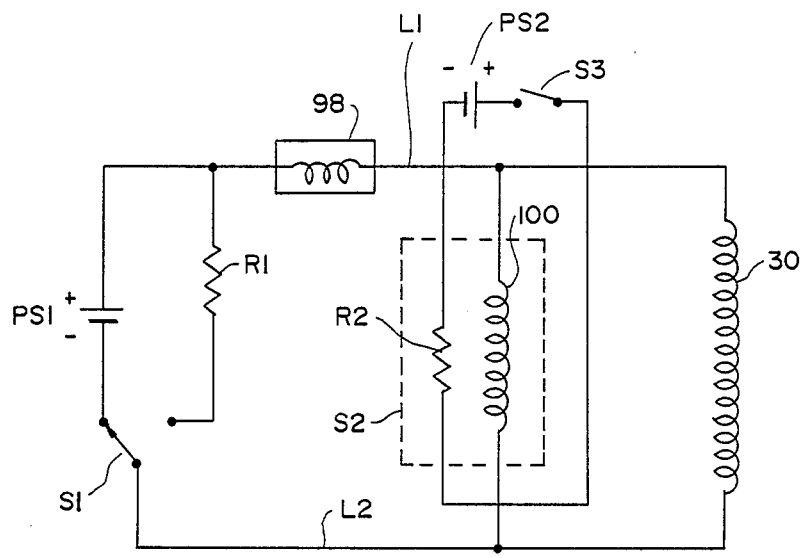
FIG. 3 is an electrical schematic diagram depicting various electrical components of the magnet system, including the power leads.

Referring to the electrical schematic of FIG. 3, the main superconductive coil 30 is connected by power leads L1, L2 through the solenoid coil 98 to either an external main power supply PS1 or external power dissipative means, for example, a load resistor R1, depending on the position of a single-pole double-throw switch S1. Shunting the main coil 30 is the winding 100 of a persistent switch S2. The winding 100 is made of superconductive wire and is located in the containment vessel 28 so that the winding may be maintained below its critical temperature. The persistent switch S2 also includes a small resistance heater R2 in heat exchange relationship with winding 100. Heater R2 is connected to an auxiliary power supply PS2 through a single-pole single-throw switch S3. Closing the switch S3 causes sufficient heat to be supplied to winding 100 to render it normal causing the winding to act as an open circuit so the main coil 30 is effectively connected to either the power supply PS1 (for charging) or load resistor R1 (for discharging). Opening of the switch S3 allows the winding 100 to cool below its critical temperature to go superconductive. In this state, winding 100 has zero resistance and effectively shunts main coil 30 to permit the current to circulate through the main coil 30 and winding 100 encountering substantially no resistance.

operation of the magnet system 20 of the present invention is as follows. To charge the main coil 30, after the persistent switch winding 100 is heated above its critical temperature, the switch S1 is moved to connect the main power supply PS1. The nominal 35 to 50 amps flowing through the power leads to charge the main coil also flow through the solenoid coil 98 causing switching of the solenoid valve 96 to its open position. More specifically, when switch S1 is moved to connect the power supply PS1, current flowing through the coil increases slowly because time is required for the magnetic field generated by the coil 30 to build. After, for example, two minutes the current flowing through the solenoid coil 98 is up to, for example, 12 amps which is sufficient for switching of the valve 96 to its open position. This permits a relatively high flow rate of the cold helium gas through the stainless steel tubes 50 to compensate for the heat generated by their resistance heating. Upon full charging of the main coil 30, switch S3 is opened resulting in cooling of the persistent switch winding 100 below its critical temperature. This causes the main coil to go into its persistent mode of operation in which the current flows through coil 30 and winding 100 with substantially zero resistance. As no current is flowing through the solenoid coil 98, the solenoid valve returns to its closed first position due to the bias spring thereby closing the path for the rapid escape of helium gas. However, there is a continuous trickling of the helium gas through the flow controls 86, 88 and check valve 90 to compensate for thermal conduction of the stainless steel tubes 50. It is noted that as soon as the main coil 30 goes into its persistent mode, the switch S1 is immediately switched to its position disconnecting power supply PS1 and connecting the load resistor R1. Thus, the circuit provides a safety feature, not available with retractable leads, in that the load resistor is continuously connected to the main coil and so that an internal load resistor is not required.

When the main coil 30 is to be discharged, switch S3 is closed causing the heater R2 to supply sufficient heat to the winding 100 causing its temperature to rise above the critical temperature. The winding 100 then represents an open (high resistance) circuit and the current flowing through the main coil now flows through the flow resistor R1 by means of the solenoid valve coil 98. Again the current flowing through the solenoid coil causes the solenoid valve 96 to open allowing the high rate of escape of helium gas to carry away the heat due to the resistance heating of the stainless steel tubes 50.

While the thin wall stainless steel tubes may have greater electrical resistance than the prior art copper power leads, they also represent higher resistance to thermal conduction than do the copper power leads. The stainless steel tubes therefore do not cause as great a consumption of liquid helium when the main coil is in its persistent mode of operation, which is almost all the time. It is only when the main coil is being charged or discharged that the stainless steel tubes cause greater heating, due to their greater electrical resistance. However, the present invention overcomes this disadvantage by automatically causing a greater flow of helium gas to take away this excess heat. As the time that the coil is charging or discharging is almost inconsequential compared to the time the coil is in its persistent mode of operation, the net result is much lower consumption of the expensive liquid helium. Even more importantly, the provision of the automatic cooling of the stainless steel tubes allows for the installation of permanent power leads, thus avoiding the numerous problems attendant the use of the removable leads, such as the formation of ice and the need for an internal load resistor. The cooling of the power leads is automatic, that is, in response to the current in the leads reaching a predetermined level and with no action required on the part of the operator. The power leads have no moving parts and provide a safety factor in that they are always connected to the external load resistor. While the power leads of the present invention have been described in the environment of a magnet system for magnetic resonance imaging, it will be appreciated that the power leads can also be used on other magnet systems having superconductive coils.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. A magnet system for providing a magnetic field comprising:
   a vacuum vessel;
   a cryogenic containment vessel supported within said vacuum vessel and containing a main coil having a first end and a second end and formed of superconductive wire for providing said magnetic field, along with a quantity of liquid helium to maintain said wire below its critical temperature, the pressure inside said containment vessel being greater than atmospheric pressure;
   a pair of power leads for supplying energy to said coil from a power supply outside said vacuum vessel and for taking energy from said coil to power dissipative means disposed outside said vacuum vessel, each of said leads connected to one of said coil ends, extending outside said vacuum vessel and comprising an elongate metallic tube; and
   means responsive to the passage of electrical current through the tubes of said leads to cause helium gas resulting from the boiling of liquid helium in said containment vessel to be vented to atmosphere through said tubes thereby cooling said tubes.

2. A magnet system as set forth in claim 1 further comprising means for continuously venting to atmosphere through said tubes a quantity of helium gas from said containment vessel which is small in relation to the quantity of helium gas passing through said tubes due to operation of said means responsive to passage of electrical current.

3. A magnet system as set forth in claim 1 wherein said means responsive to the passage of electrical current comprises a solenoid valve assembly including a solenoid coil connected in series with said main coil across said power supply when said main coil is being energized, connected in series with said main coil across said power dissipative means when said main coil is being deenergized, and functionally disconnected from said main coil by being shunted with respect to said main coil when the main coil is in its persistent mode generating said magnetic field.

4. A magnet system as set forth in claim 3 wherein said solenoid valve assembly further includes a valve body holding a valve biased to a closed position wherein it blocks passage of said helium gas to atmosphere and movable to an open position wherein it permits passage of said helium gas to atmosphere, energization of said coil causing movement of said valve to its open position.

5. A magnet system as set forth in claim 1 wherein said magnet system further comprises at least one thermal radiation shield disposed between said cryogenic containment vessel and said vacuum vessel, said vacuum vessel including a substantially cylindrical outer wall with a turret extending outwardly therefrom.

6. A magnet system as set forth in claim 5 further comprising a generally cylindrical bellows section connected from said containment vessel to said turret and through said shield, said power leads extending from said containment vessel, through said bellows section and out of said turret.

7. A magnet system as set forth in claim 1 wherein each of said leads includes a plug of conductive material inserted into an end of its tube, said plug being connected to one of said ends of said main coil and having an opening for the entrance of helium gas from said containment vessel into said tube.

8. A magnet system as set forth in claim 1 wherein said tubes are metallic.

9. A magnet system as set forth in claim 8 wherein each of said power leads further comprises a copper tube disposed outside of said vacuum vessel and connected to said power supply.

10. A magnet system as set forth in claim 9 wherein each of said power leads further comprises an electrical connector supported by said vacuum vessel and joining a stainless steel tube and a copper tube.

11. An improvement in a magnet system for providing a high strength magnetic field, said magnet system comprising:

a vacuum vessel including a first wall defining a bore;

a cryogenic containment vessel supported within said vacuum vessel and containing a main coil having a first end and a second end and formed of superconductive wire for providing said magnetic field, along with a quantity of liquid helium to maintain said wire below its critical temperature, the pressure inside said containment vessel being greater than atmospheric pressure;

a pair of permanently installed power leads for supplying energy to said coil from a power supply outside said vacuum vessel and for supplying energy from said coil to power dissipative means disposed outside said vacuum vessel, each of said leads being connected to one of said coil ends and extending outside said vacuum vessel, said improvement comprising:

each of said power leads comprising an elongate metallic tube, said magnet system further comprising solenoid valve means including coil means interconnected with said coil, said power supply and said power dissipative means, said solenoid valve means further comprising valve means for selectively venting helium gas from said containment vessel to atmosphere through the metallic tubes, said solenoid means being responsive to passage of electrical current through said tubes to vent said gas thereby cooling said power leads.

* * * * *